United States Patent
Rolfson

(10) Patent No.: US 6,506,689 B2
(45) Date of Patent: *Jan. 14, 2003

(54) METHOD FOR REMOVING CONTAMINANTS FROM A SEMICONDUCTOR WAFER

(75) Inventor: J. Brett Rolfson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/804,604

(22) Filed: Mar. 12, 2001

(65) Prior Publication Data

US 2001/0009814 A1 Jul. 26, 2001

Related U.S. Application Data

(63) Continuation of application No. 09/584,240, filed on May 30, 2000, which is a continuation of application No. 08/729,855, filed on Oct. 15, 1996, now Pat. No. 6,114,254.

(51) Int. Cl.$^7$ ............................................. H01L 21/469
(52) U.S. Cl. ....................................... 438/759; 438/906
(58) Field of Search ........................... 438/3, 240, 906, 438/974, 759, FOR 457; 134/1.3

(56) References Cited

U.S. PATENT DOCUMENTS

| | | | |
|---|---|---|---|
| 4,113,492 A | 9/1978 | Sato et al. | 96/67 |
| 4,510,176 A | 4/1985 | Cuthbert et al. | 427/273 |
| 4,518,678 A | 5/1985 | Allen | 430/311 |
| 4,685,975 A | 8/1987 | Kottman et al. | 134/33 |
| 4,732,785 A | 3/1988 | Brewer | 437/240 |
| 4,804,438 A | 2/1989 | Rhodes | 156/653 |
| 4,886,728 A | 12/1989 | Salamy et al. | 430/331 |
| 5,171,393 A | 12/1992 | Moffat | 156/345 |
| 5,223,443 A | 6/1993 | Chinn et al. | 437/8 |
| 5,289,057 A | 2/1994 | Kinugasa | 307/475 |
| 5,362,608 A | 11/1994 | Flaim et al. | 430/327 |
| 5,423,285 A | 6/1995 | Paz de Araujo et al. | 117/90 |
| 5,508,881 A | 4/1996 | Stevens | 361/305 |
| 5,601,655 A | 2/1997 | Bok et al. | 134/1 |
| 5,935,549 A * | 8/1999 | Ami et al. | 423/593 |
| 6,114,254 A | 9/2000 | Rolfson | 438/758 |

* cited by examiner

Primary Examiner—Wael Fabmy
Assistant Examiner—Thanh V Pham
(74) Attorney, Agent, or Firm—Ormiston & McKinney, PLLC

(57) ABSTRACT

A method for removing contaminants from a semiconductor wafer having a spin on coating of material. Contaminants are removed by applying a cleaning solution to the periphery, and preferably, the exposed backside of the wafer after the edge bead has been dissolved and removed. The cleaning solution is formulated to react chemically with unwanted coating material residue to form a compound that may be ejected from the periphery of the spinning wafer. Any residual solution or precipitate that is not ejected from the wafer may be rinsed away with water, preferably deionized water. One exemplary use of this method is the removal of metallic contaminants that may be left on the periphery and backside of a wafer after the formation of ferroelectric film coatings. A cleaning solution comprising a mixture of hydrochloric acid HCl and water $H_2O$ or, ammonium hydroxide $NH_4OH$ and water $H_2O$ is applied to the periphery of the spinning wafer. The cleaning solution will react with any residual metal ions to form a metal chloride or metal hydroxide that is ejected from the wafer along with the cleaning solution.

2 Claims, 3 Drawing Sheets

METHOD FOR REMOVING CONTAMINANTS FROM A SEMICONDUCTOR WAFER

CROSS REFERENCE TO RELATED APPLICATIONS

This is a continuation of application Ser. No. 09/584,240 filed May 30, 2000, which is a continuation of application Ser. No. 08/729,855 filed Oct. 15, 1996, now Pat. No. 6,114,254.

BACKGROUND OF THE INVENTION

1. Technical Field

The invention relates generally to the manufacture of semiconductor devices. More particularly, the invention relates to a method for removing contaminants from a semiconductor wafer by applying a cleaning solution to the wafer as part of the spin coat fabrication process.

2. Background

Thin film fabrication techniques are commonly used in the manufacture of semiconductor devices. A variety of materials can be deposited as thin films, including photoresist, metals, and insulators. The composition and uniformity of thin films must be strictly controlled to facilitate etching submicron features into these films. Some of these materials are applied by coating the semiconductor wafer with a liquid which is dried to form a thin solid film. The liquid materials are most often coated onto the wafer using either a spin or spray coating process. In a conventional spin coating process, coating materials are applied by flowing liquid coating material onto the top surface of the semiconductor wafer while it is spinning. The wafer is held on a disk shaped, rotating spin chuck. The diameter of the chuck is typically somewhat less than the diameter of the wafer. The chuck is positioned so that the wafer lies on the chuck in a level horizontal plane. In operation, the bottom/inactive surface of the wafer is placed onto the chuck. The chuck applies a suction to the bottom of the wafer to hold the wafer in place on the chuck. The chuck is rotated by a motor driven axle that extends down from the chuck. As the wafer is rotated on the chuck, liquid coating material is applied to the center of the wafer. The coating material spreads radially outward from the center of the wafer towards the periphery to coat the top of the wafer. Ideally, all excess coating material is ejected from the periphery of the wafer. In practice, however, some excess material collects at the periphery of the wafer. The bead of coating material that forms at the periphery of the wafer is commonly referred to as an "edge bead." In addition, coating material often splashes onto the exposed bottom surface of the wafer.

After the material has been spin coated onto the wafer, a solvent is dispensed along the periphery of the wafer and on the exposed bottom surface or "backside" of the wafer to dissolve the edge bead and remove the coating material from the periphery and bottom of the wafer. The edge bead removal solvent may dispensed through a nozzle directed toward the bottom of the wafer, in which case it curls up around to the top of the wafer to dissolve the edge bead, or the solvent may be dispensed directly onto the periphery of the wafer, or preferably both. The edge bead removal solvent may leave trace amounts of coating material residue on the periphery and exposed bottom surface of the wafer. Unwanted residue, particularly metal residue, on the periphery and bottom of the wafers is a source of potentially harmful cross-contamination. Photoresist and other common coatings are formulated to have low metallic ion on transition metal contamination. However, sufficiently low metallic ion contamination and other film performance criteria cannot always be achieved simultaneously. For example, newer film formulations intended for use in ferroelectric random access memory (FRAM) applications contain metals. These metallic film formulations, which are necessary for FRAM device performance, are a source of contamination that may be carried to other wafers, products and processing stations.

SUMMARY OF THE INVENTION

The present invention is directed to a novel method for removing contaminants from a semiconductor wafer having a spin on coating of material. Contaminants are removed by applying a cleaning solution to the periphery, and preferably, the exposed backside of the wafer after the edge bead has been dissolved and removed. The cleaning solution is formulated to react chemically with unwanted coating material residue to form a compound that may be ejectd from the periphery of the spinning wafer. Any residual solution or precipitate that is not ejected from the wafer may be rinsed away with water, preferably deoinized water. One exemplary use of this method is the removal of metallic contaminants that may be left on the periphery and backside of a wafer after the formation of ferroelectric film coatings. A cleaning solution comprising a mixture of hydrochloric acid HCL and water $H_2O$ or ammonium hydroxide $NH_4OH$ and water $H_2O$ is applied to the periphery of the spinning wafer. The cleaning solution will react with any residual metal ions to forma metal chloride or metal hydroxide that is ejected from the wafer along with the cleaning solution.

DETAILED DESCRIPTION OF THE INVENTION

Figure 1:
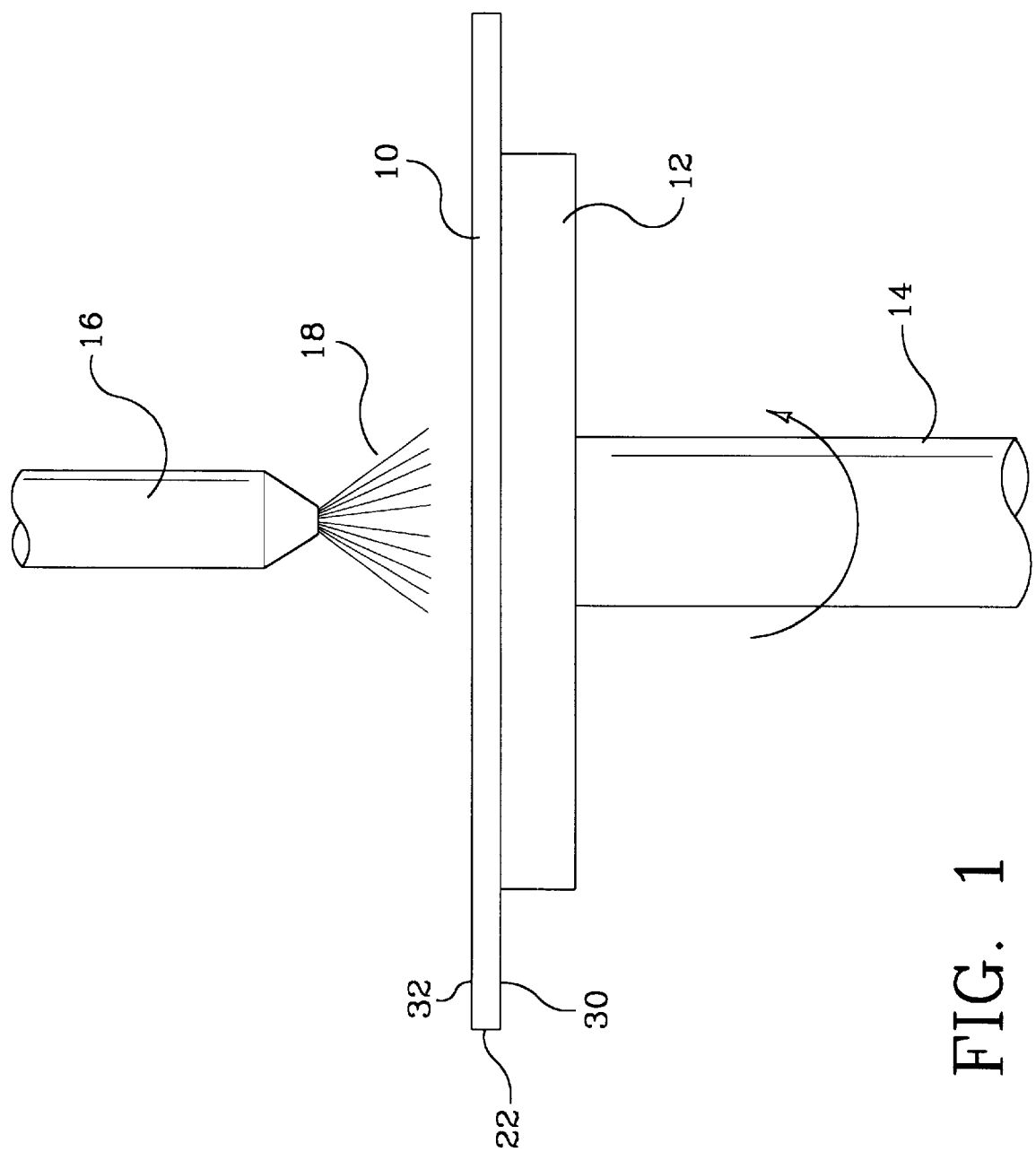
FIG. 1 is a partial side view of a conventional spin coating device showing a coating material being applied to the top surface of the semiconductor wafer.
Figure 2:
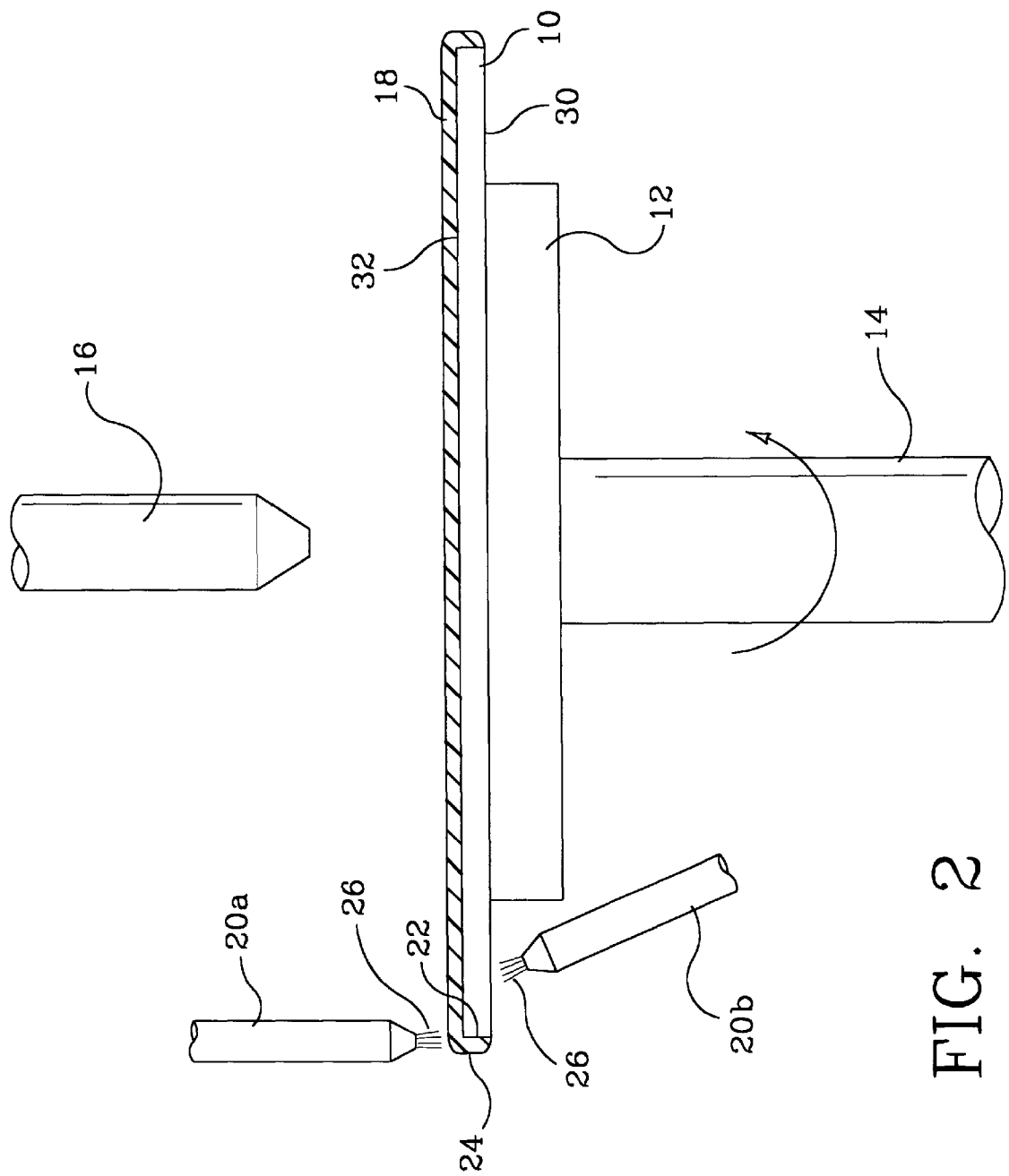
FIG. 2 is a partial side view of the spin coating device of FIG. 1 showing application of the edge bead removal solvent after formation of a thin film of coating material.
Figure 3:
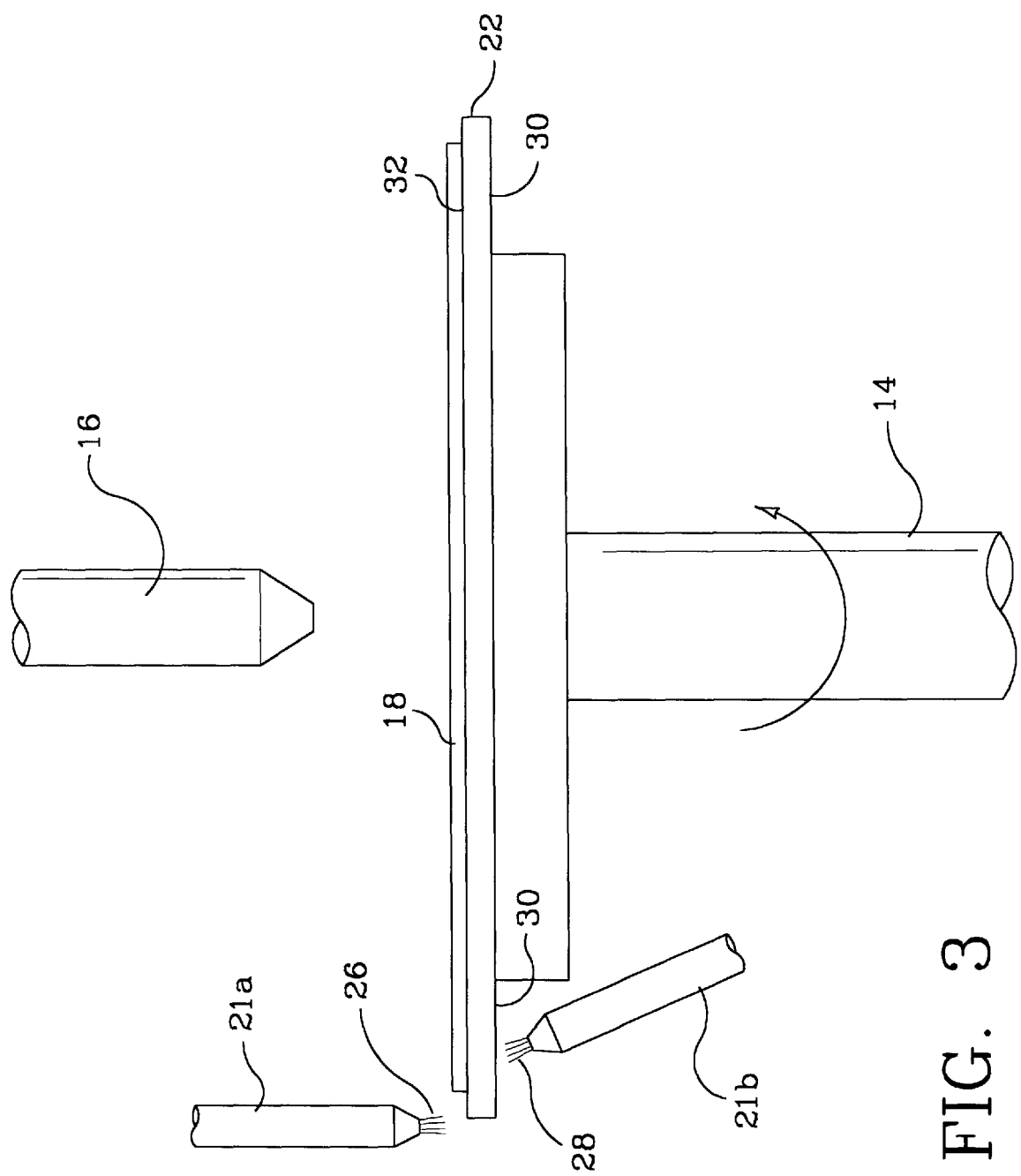
FIG. 3 is a partial side view of the spin coating device of FIG. 1 showing application of the cleaning solution after application of the edge bead removal solvent.

FIGS. 1–3 are partial side views of a conventional spin coating device showing the application of a liquid coating material at various stages in the spin coating process. Wafer 10 is positioned on spin chuck 12. Spin chuck 12 is mounted on axle 14. Axle 14 is operatively coupled to a drive mechanism, such as an electric motor (not shown). The diameter of spin chuck 12 is less than the diameter of wafer 10 so that wafer 10 extends beyond the periphery of spin chuck 12. A first nozzle 16 for dispensing a coating material onto wafer 10 is positioned above and, typically, at the center of wafer 10. Second nozzles 20a and 20b for dispensing an edge bead removal solvent and cleaning solution are disposed above and below the periphery 22 of wafer 10. In operation, a suction is applied to the wafer 10 to hold it in place on spin chuck 12. Spin chuck 12 is rotated to spin wafer 10 as a liquid coating material 18 is applied through first nozzle 16. Typically, the desired film material is suspended in a solvent to form the liquid coating material that is applied to the wafer. The coating material 18 is distributed across top surface 32 of wafer 10 largely due to centrifugal forces created by the spinning wafer.

A shown in FIG. 2, excess coating material tends to collect at and form a bead 24 along the periphery 22 of wafer 10. To remove edge bead 24, a solvent 26 is sprayed through nozzle 20a onto the periphery 22 of wafer 10 as it is spun to dissolve the coating material at the periphery of the wafer. The edge bead removal solvent 26 may also be dispensed through nozzle 20b directed toward the exposed bottom surface 30 of wafer 10.

Referring to FIG. 3, application of the edge bead removal solvent is followed by the application of a cleaning solution 28 to the spinning wafer to further remove residual coating materials from periphery 22 and exposed bottom surface 30 of wafer 10. Cleaning solution 28 is dispensed through nozzles 21a and 21b, preferably in the same pattern as the edge bead removal solvent. Although the use of separate nozzles is preferred, the same nozzles may be used to dispense solvent 26 and cleaning solution 28 if the nozzles are rinsed between applications to remove any residual solvent or solution. Conventional spin coating machines, such as a Silicon Valley Group (SVG) Coat Track or Tokyo Electron Ltd. (TEL) Mark 8, could be adapted for use in dispensing the cleaning solution. Alternatively, and particularly for those spin coating machines that do not dispense the edge bead removal solvent onto the bottom of the wafer, the cleaning solution will be applied by a separate piece of manufacturing equipment at a downstream processing station.

Unlike the edge bead removal solvent in which the coating material is dissolved, cleaning solution is formulated to react chemically with unwanted coating material residue to form a compound that may be ejected from the periphery of the spinning wafer, as either a precipitate or solute along with the cleaning solution. Any residual solution or precipitate that is not ejected from the spinning wafer may be rinsed away with water, preferably deionized water. Preferably the cleaning solution is formulated so that the reaction product is soluble in water to help ensure all traces of coating material residue are removed from the periphery and bottom surface of the wafer. One exemplary use of the present invention is the removal of metallic contaminants that may be left on the periphery and bottom of the water after formation of ferroelectric film coatings. Ferroelectric films used in the formation of ferroelectric random access memories (FRAMs) are typically formulated using a combination of various metallic elements including, for example, strontium Sr, bismuth Bi and tantalum Ta. After the ferroelectric film has been coated on to the top surface of the wafer, the edge bead is dissolved in a solvent and the wafer is spun to remove the film from the periphery and bottom of the wafer. Many commonly used solvents, such as butyl acetate, xylene and ethyl acetate, may be used to solubilize the film. Then, a dilute mixture of hydrochloric acid HCl and water $H_2O$ is sprayed on to the periphery of the wafer and the exposed bottom surface of the wafer as a cleaning solution to remove unwanted metallic contaminants. The cleaning solution may range from a very dilute mixture of about 1 part HCl to about 1,000 parts water to a more conventional concentration of about 1 part HCl to about 5 parts water. The hydrochloric acid will react with any residual metal ions to form a metal chloride that is ejected from the spinning wafer along with the cleaning solution. Other preferred compositions for cleaning solution 28 include a mixture of hydrochloric acid HCl, water $H_2O$ and hydrogen peroxide $H_2O_2$ and ammonium hydroxide $NH_4OH$, water $H_2O$ and hydrogen peroxide $H_2O_2$. The concentrations for both of these mixtures is about 1 part HCl to about 5 parts each of $H_2O$ and $H_2O_2$.

There has been shown and described a method for removing contaminants from a semiconductor wafer having a spin on coating of material. The particular embodiments shown and described herein are for purposes of example and should not be construed to limit the invention as set forth in the appended claims.

What is claimed is:

1. A method for the manufacture of a semiconductor wafer, comprising the steps of:

applying a ferroelectric coating material to a top surface of the semiconductor wafer;

spinning the wafer;

applying a solvent in which the coating material is soluble to the periphery of the spinning wafer;

applying a cleaning solution to the periphery of the spinning wafer; and then rinsing the periphery of the wafer with water.

2. A method of processing a ferroelectric random access memory, comprising the steps of:

applying a combination of metallic elements including a selection of strontium, bismuth, and tantalum to the top surface of a semiconductor wafer;

spinning the wafer to form a metallic film on the wafer;

applying a solvent in which the metallic film is soluble to the periphery of the spinning wafer to remove substantially all of the film from the periphery;

applying a cleaning solution to the periphery of the spinning wafer to remove from the periphery any metallic residue remaining after application of the solvent; and then rinsing the periphery of the water with water.

\* \* \* \* \*